US012668872B2

(12) United States Patent
Quayle

(10) Patent No.: US 12,668,872 B2
(45) Date of Patent: Jun. 30, 2026

(54) VARIABLE-TEMPERATURE VAPOR DEPOSITION PROCESS

(71) Applicant: Great Lakes Crystal Technologies, Inc., East Lansing, MI (US)

(72) Inventor: Paul Connolly Quayle, East Lansing, MI (US)

(73) Assignee: Great Lakes Crystal Technologies, Inc., East Lansing, MI (US)

( * ) Notice: Subject to any disclaimer, the term of this patent is extended or adjusted under 35 U.S.C. 154(b) by 46 days.

(21) Appl. No.: 18/396,504

(22) Filed: Dec. 26, 2023

(65) Prior Publication Data
US 2024/0209498 A1     Jun. 27, 2024

Related U.S. Application Data

(60) Provisional application No. 63/477,014, filed on Dec. 23, 2022.

(51) Int. Cl.
*C23C 16/27*     (2006.01)
*C23C 16/52*     (2006.01)

(52) U.S. Cl.
CPC .......... *C23C 16/276* (2013.01); *C23C 16/277* (2013.01); *C23C 16/52* (2013.01)

(58) Field of Classification Search
CPC ..... C23C 16/27; C23C 16/272; C23C 16/276; C23C 16/277
See application file for complete search history.

(56) References Cited

U.S. PATENT DOCUMENTS 7,687,146 B1 *  3/2010  Freitas, Jr. ............ B82B 3/0019
                                                                            428/408
9,023,306 B2 *  5/2015  Hemley .................. C30B 29/04
                                                                            117/88
(Continued)

FOREIGN PATENT DOCUMENTS

EP       1292726 B1 *  9/2008   ............. C30B 25/02
GB       2497660 A  *  6/2013   ............. C30B 29/04
(Continued)

OTHER PUBLICATIONS

Windischmann, H., et al., "Intrinsic stress in diamond films prepared by microwave plasma CVD". J. Appl. Phys. 69, 2231-2237 (1991).*
(Continued)

*Primary Examiner* — Bret P Chen
(74) *Attorney, Agent, or Firm* — Foster Swift Collins & Smith PC; Mikhail Murshak

(57)     ABSTRACT
A method of growing a single crystal diamond material synthesized using a homoepitaxial chemical vapor deposition process. The method includes the steps of placing a free-standing diamond starting seed substrate on a substrate holder within a reaction chamber for chemical vapor deposition; feeding a process gas into the reaction chamber, the process gas including hydrogen gas; igniting a plasma within the reaction chamber to activate the process gas by adjusting the substrate temperature to increase to a first target substrate temperature; adding a carbon-containing gas to the process gas once the substrate temperature is at or near the first target substrate temperature to initiate diamond growth; and adjusting the substrate temperature to a second target substrate temperature that is different from the first target substrate temperature during the diamond growth.

29 Claims, 14 Drawing Sheets

(56) References Cited

U.S. PATENT DOCUMENTS

| | | | | |
|---|---|---|---|---|
| 2009/0239078 A1* | 9/2009 | Asmussen | ......... | H01J 37/32192 |
| | | | | 428/408 |
| 2009/0308305 A1* | 12/2009 | Mokuno | ................. | C30B 25/00 |
| | | | | 117/108 |
| 2010/0166636 A1* | 7/2010 | Yamada | .................. | C30B 23/00 |
| | | | | 117/1 |
| 2016/0218183 A1* | 7/2016 | Choe | .................... | H10D 62/405 |
| 2021/0066078 A1* | 3/2021 | Ohmagari | ............. | C30B 25/205 |

FOREIGN PATENT DOCUMENTS

| | | | | | | |
|---|---|---|---|---|---|---|
| JP | H08151296 | A | * | 6/1996 | ............. | C30B 29/04 |
| JP | 3728467 | | * | 10/2005 | ............. | C30B 29/04 |
| JP | 2010-24067 | A | * | 2/2010 | ............. | C30B 29/04 |
| WO | WO 2003/071608 | | * | 8/2003 | ............. | H01L 33/00 |
| WO | WO 2016/194931 | A1 | * | 12/2016 | | |
| WO | WO 2018/087110 | A1 | * | 5/2018 | ............. | C30B 25/12 |

OTHER PUBLICATIONS

Chen, Chia-Fu, et al., "The role of hydrogen in diamond synthesis from carbon dioxide-hydrocarbon gases by microwave plasma chemical vapor deposition". Surface and Coatings Technology, vols. 54-55, Part 2, 1992, pp. 368-373. Abstract Only.*

Yan, C., et al., "Very high growth rate chemical vapor deposition of single-crystal diamond". PNAS, vol. 99, No. 20, Oct. 1, 2002, pp. 12523-12525.*

Mokuno, Y., et al., "Synthesis of large single crystal diamond plates by high rate homoepitaxial growth using microwave plasma CVD and lift-off process". Diamond and Related Materials, vol. 17, Issues 4-5, Apr.-May 2008, pp. 415-418.*

Li, Yicun, et al., "Growth of single-crystal diamond by microwave plasma CVD with high precursor utilization using cyclic gas injection and control of carbonaceous species content with optical emission spectroscopy". Vacuum 206 (2022) 111529, pp. 1-8.*

* cited by examiner

102

102

FIG. 2A
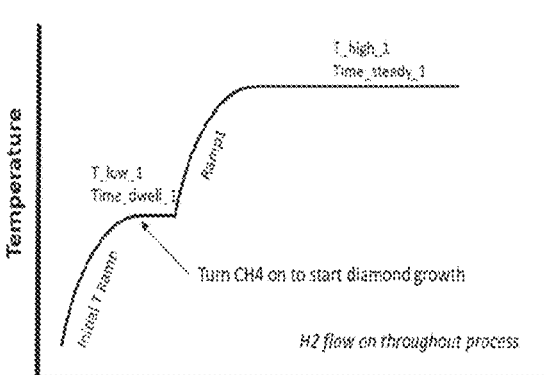
FIG. 2B
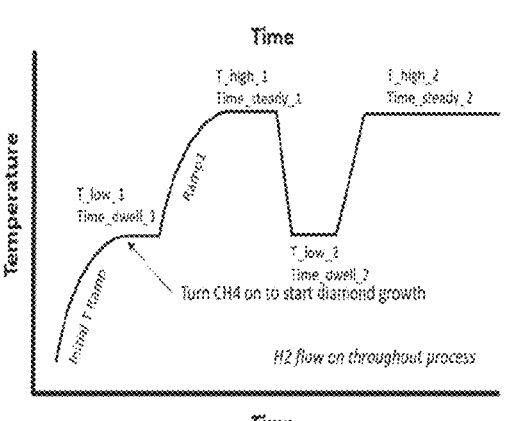
FIG. 2C
Adjustable Parameters:
1) T_low_1...n
2) Time_dwell_1...n
3) RampUp_1...n
4) T_high_1...n
5) Time_steady_1...n
6) RampDown_1...n
FIG. 2D

300

GLCT_096

GLCT_101

HPHT Seed Substrate

GLCT_205 Grown on HPHT Seed Substrate

Figure 14:
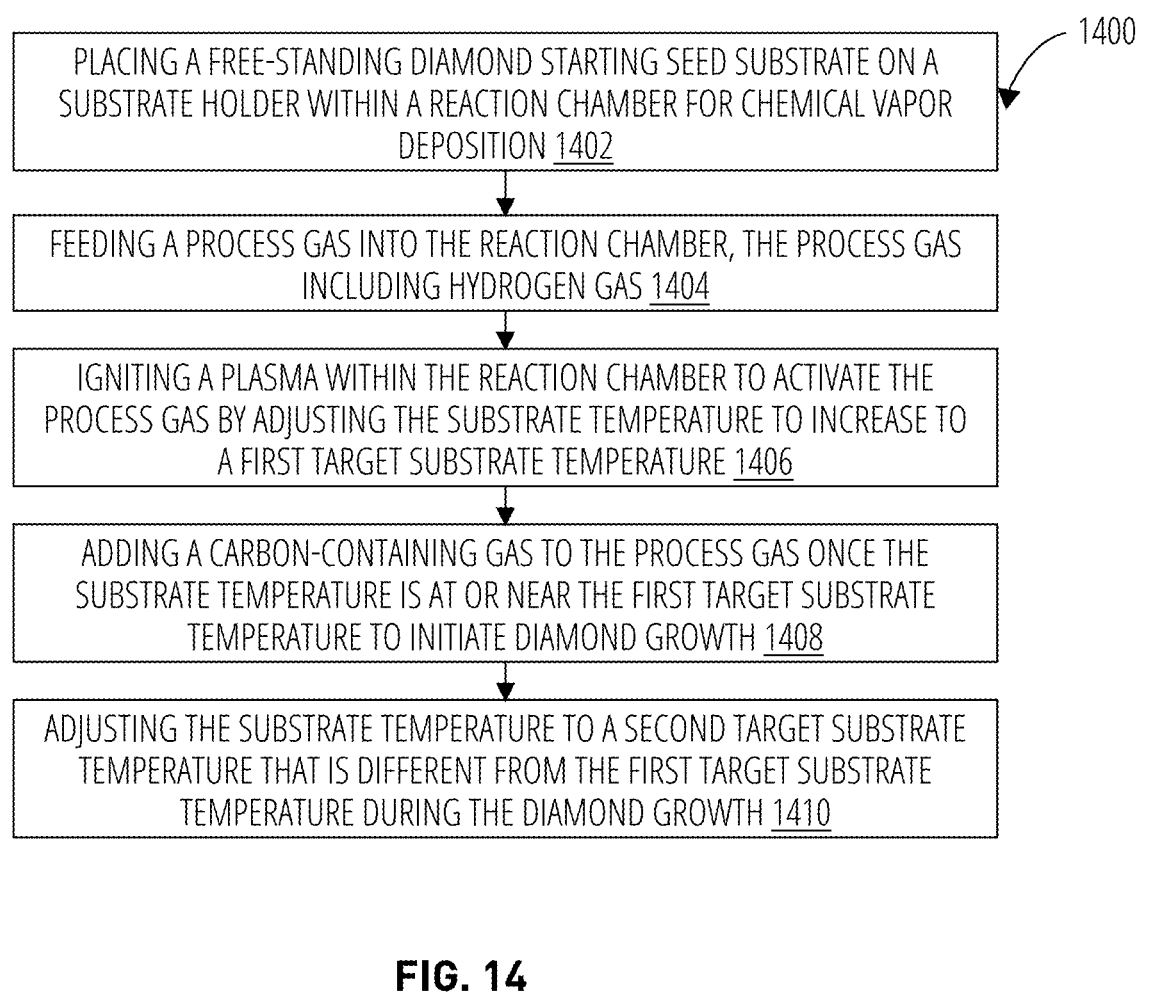

1400

PLACING A FREE-STANDING DIAMOND STARTING SEED SUBSTRATE ON A SUBSTRATE HOLDER WITHIN A REACTION CHAMBER FOR CHEMICAL VAPOR DEPOSITION 1402

↓

FEEDING A PROCESS GAS INTO THE REACTION CHAMBER, THE PROCESS GAS INCLUDING HYDROGEN GAS 1404

↓

IGNITING A PLASMA WITHIN THE REACTION CHAMBER TO ACTIVATE THE PROCESS GAS BY ADJUSTING THE SUBSTRATE TEMPERATURE TO INCREASE TO A FIRST TARGET SUBSTRATE TEMPERATURE 1406

↓

ADDING A CARBON-CONTAINING GAS TO THE PROCESS GAS ONCE THE SUBSTRATE TEMPERATURE IS AT OR NEAR THE FIRST TARGET SUBSTRATE TEMPERATURE TO INITIATE DIAMOND GROWTH 1408

↓

ADJUSTING THE SUBSTRATE TEMPERATURE TO A SECOND TARGET SUBSTRATE TEMPERATURE THAT IS DIFFERENT FROM THE FIRST TARGET SUBSTRATE TEMPERATURE DURING THE DIAMOND GROWTH 1410

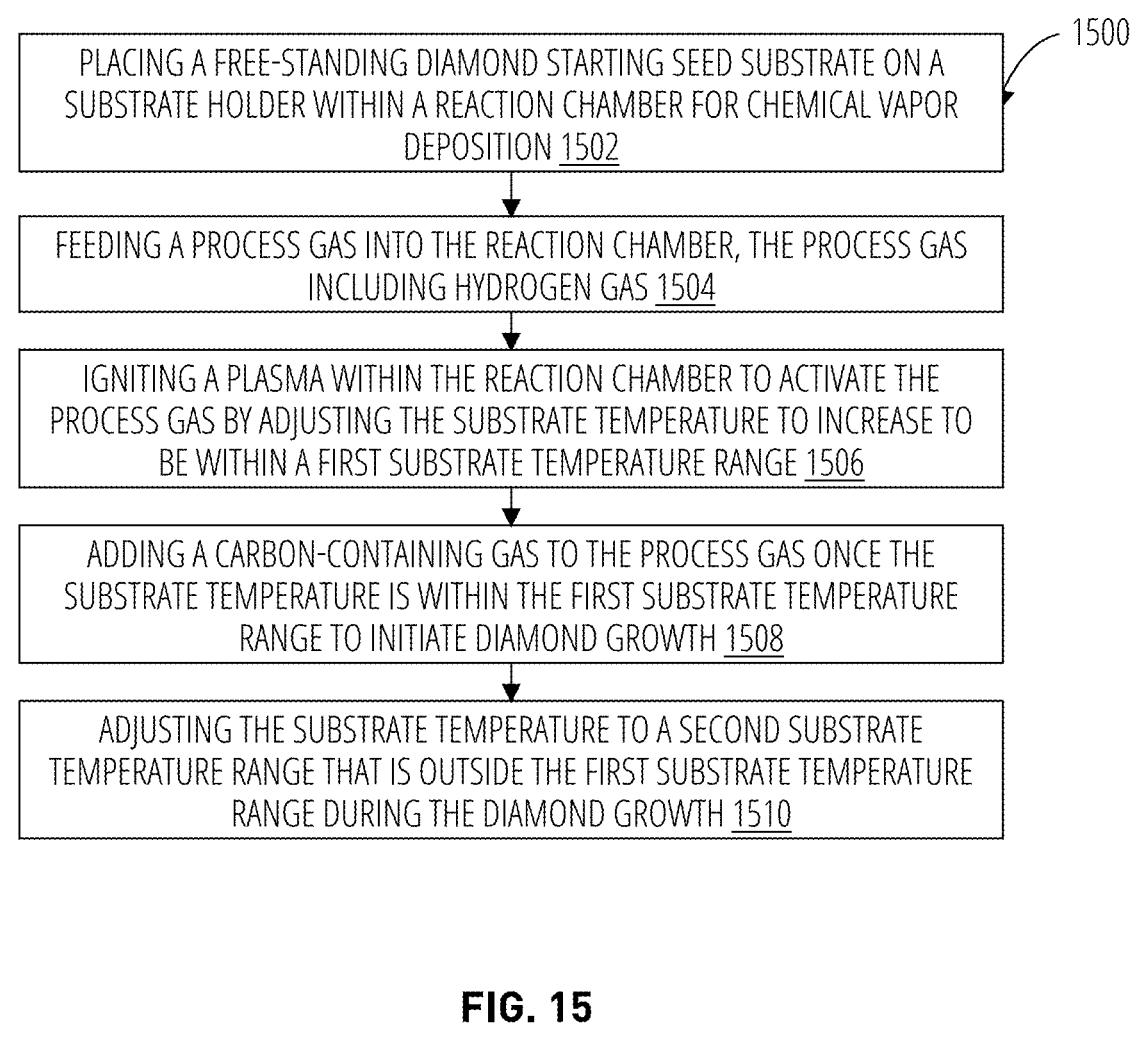

PLACING A FREE-STANDING DIAMOND STARTING SEED SUBSTRATE ON A SUBSTRATE HOLDER WITHIN A REACTION CHAMBER FOR CHEMICAL VAPOR DEPOSITION 1502

↓

FEEDING A PROCESS GAS INTO THE REACTION CHAMBER, THE PROCESS GAS INCLUDING HYDROGEN GAS 1504

↓

IGNITING A PLASMA WITHIN THE REACTION CHAMBER TO ACTIVATE THE PROCESS GAS BY ADJUSTING THE SUBSTRATE TEMPERATURE TO INCREASE TO BE WITHIN A FIRST SUBSTRATE TEMPERATURE RANGE 1506

↓

ADDING A CARBON-CONTAINING GAS TO THE PROCESS GAS ONCE THE SUBSTRATE TEMPERATURE IS WITHIN THE FIRST SUBSTRATE TEMPERATURE RANGE TO INITIATE DIAMOND GROWTH 1508

↓

ADJUSTING THE SUBSTRATE TEMPERATURE TO A SECOND SUBSTRATE TEMPERATURE RANGE THAT IS OUTSIDE THE FIRST SUBSTRATE TEMPERATURE RANGE DURING THE DIAMOND GROWTH 1510

FIG. 15

1600

PLACING A DIAMOND SUBSTRATE ON A SUBSTRATE HOLDER WITHIN A CHEMICAL VAPOR DEPOSITION REACTION CHAMBER 1602

FEEDING A PROCESS GAS INTO THE REACTION CHAMBER, THE PROCESS GAS INCLUDING HYDROGEN GAS 1604

IGNITING A PLASMA WITHIN THE REACTION CHAMBER TO ACTIVATE THE PROCESS GAS BY ADJUSTING A SUBSTRATE TEMPERATURE TO BE WITHIN A FIRST TEMPERATURE RANGE DEFINING A BI-DIMENSIONAL NUCLEATION GROWTH REGIME 1606

FEEDING A CARBON-CONTAINING GAS TO THE PROCESS GAS TO GROW DIAMOND ON THE DIAMOND SUBSTRATE WITHIN A BI-DIMENSIONAL NUCLEATION GROWTH REGIME 1608

ADJUSTING THE SUBSTRATE TEMPERATURE TO A SECOND SUBSTRATE TEMPERATURE RANGE THAT IS OUTSIDE THE FIRST SUBSTRATE TEMPERATURE RANGE DURING THE DIAMOND GROWTH, WHEREIN THE SECOND SUBSTRATE TEMPERATURE RANGE DEFINES A STEP-FLOW GROWTH REGIME 1610

FIG. 16

VARIABLE-TEMPERATURE VAPOR DEPOSITION PROCESS

This application claims priority to and the benefit of U.S. Provisional Patent Application No. 63/477,014, titled "VARIABLE-TEMPERATURE VAPOR DEPOSITION PROCESS," and filed on Dec. 23, 2022, the disclosure of which is incorporated herein by reference in its entirety for all purposes.

GOVERNMENT LICENSE RIGHTS

This invention was made with government support under contract #FA864920P0988 awarded by the Air Force Research Laboratory. This invention was further made with government support under contract award #DE-SC0020671. The government has certain rights in the invention.

FIELD

The present disclosure generally relates to a process for formation of Homoepitaxial Diamond by chemical vapor deposition (CVD).

BACKGROUND

The statements in this section merely provide background information related to the present disclosure and may not constitute prior art.

Homoepitaxial diamond grown using chemical vapor deposition (CVD) can be useful for many applications and technologies. However, the formation of defects in CVD grown diamond can limit the performance of end products. Preventing formation of defects has proven to be challenging. Typically, defects (in particular, dislocation defects) that are present in a homoepitaxial substrate, propagate to the corresponding CVD grown layer and new defects form in the CVD layer, resulting in a degradation of crystalline properties.

Historically, homoepitaxial CVD diamond growth technique occurs under set growth conditions, including growth chamber pressure, substrate temperature, process gas flow rates and composition, substrate crystallographic offcut, and growth duration. The presence of Oxygen ($O_2$) and/or Nitrogen ($N_2$) can have a significant impact on diamond growth. Changing the operating substrate temperature can also impact the growth conditions and morphologies.

Many defects that form during the CVD process are associated with hillock surface features. Hillocks commonly form on the surface of single crystal diamond substrates during growth using the CVD method. These hillocks typically transform into polycrystalline inclusions that are the source of many extended defects, especially dislocation defects. Preventing formation of hillocks/inclusions and new dislocation defects generally has proven to be a challenge. Hillock/inclusions can begin to form at the very onset of the growth process when there is a time varying change in gas chemistry.

A need remains for a method to reduce, minimize, or eliminate the formation of hillocks and inclusions, and the dislocation defects associated with them.

SUMMARY

The present disclosure provides for a process which enables growth of single crystal diamond using chemical vapor deposition (CVD) resulting in reduced, minimized, or no more dislocation defects as compared to a starting seed substrate.

In one aspect, a method of growing a single crystal diamond material synthesized using a homoepitaxial chemical vapor deposition process is provided and includes the steps of: placing a free-standing diamond starting seed substrate on a substrate holder within a reaction chamber for chemical vapor deposition, feeding a process gas into the reaction chamber, the process gas including hydrogen gas, igniting a plasma within the reaction chamber to activate the process gas by adjusting the substrate temperature to increase to a first target substrate temperature, adding a carbon-containing gas to the process gas once the substrate temperature is at or near the first target substrate temperature to initiate diamond growth, and adjusting the substrate temperature to a second target substrate temperature that is different from the first target substrate temperature during the diamond growth. The method may include where the first target substrate temperature is configured to inhibit hillock and inclusion formation to promote high crystallinity. The method may further include the step of adjusting the substrate temperature to one or more additional different substrate target temperatures. The method may also include where the second target substrate temperature is at least 10° C. higher or lower than the first target substrate temperature. The method may also include where the second target substrate temperature is at least 20° C. higher or lower than the first target substrate temperature. The method may also include where the diamond growth at or near one or more substrate target temperature(s) defines a first stage of diamond growth and the diamond growth at or near one or more substrate target temperature(s) defines a second stage of diamond growth, and where the first stage of diamond growth includes bi-dimensional nucleation growth morphologies and the second stage of diamond growth includes step-flow growth morphologies. The method may further include adjusting the carbon or non-carbon containing gas concentrations in the process gas during the growth of the diamond. The method may also include where the process gas further includes a gas selected from the group consisting of nitrogen-carrier gas, boron-carrier gas, phosphorus-carrier gas, n-type dopant carrier gas, p-type dopant carrier gas, and a combination thereof. The method may also include where the adjusting of the substrate temperature is controlled by adjusting plasma power. The method may also include where the adjusting of the substrate temperature is controlled by adjusting a resistive substrate holder heater power. The method may further include a cooling water supply and the adjusting of the substrate temperature is controlled by adjusting the cooling water supply.

In a further aspect, the present disclosure provides for a method of growing a single crystal diamond material synthesized using a homoepitaxial chemical vapor deposition process, the method includes: placing a free-standing diamond starting seed substrate on a substrate holder within a reaction chamber for chemical vapor deposition, feeding a process gas into the reaction chamber, the process gas including hydrogen gas, igniting a plasma within the reaction chamber to activate the process gas by adjusting the substrate temperature to increase to be within a first substrate temperature range, adding a carbon-containing gas to the process gas once the substrate temperature is within the first substrate temperature range to initiate diamond growth, and adjusting the substrate temperature to a second substrate temperature range that is outside the first substrate temperature range during the diamond growth.

In another aspect, a method of growing a single crystal diamond material synthesized using a homoepitaxial chemical vapor deposition process is provided. The method includes placing a diamond substrate on a substrate holder within a chemical vapor deposition reaction chamber, feeding a process gas into the reaction chamber, the process gas including hydrogen gas, igniting a plasma within the reaction chamber to activate the process gas by adjusting a substrate temperature to be within a first temperature range defining a supersaturated growth regime, feeding a carbon-containing gas to the process gas to grow diamond on the diamond substrate within a bi-dimensional nucleation growth regime, and adjusting the substrate temperature to a second substrate temperature range that is outside the first substrate temperature range during the diamond growth, where the second substrate temperature range defines a step-flow growth regime.

The method may also include where the first substrate temperature range is configured to inhibit hillock and inclusion formation to promote high crystallinity. The method may also include the steps of adjusting the substrate temperature to one or more different substrate temperature ranges. The method may also include where the first substrate temperature range, the second substrate temperature range, or the one or more different substrate temperature ranges that define a range of ±12° C. The method may also include where the first substrate temperature range, the second substrate temperature range, or the one or more different substrate temperature ranges define a range of ±10° C. The method may also include where the first substrate temperature range, the second substrate temperature range, or the one or more different substrate temperature ranges define a range of ±5° C. The method may also include where the first substrate temperature range, the second substrate temperature range, or the one or more different substrate temperature ranges define a range of ±2° C.

The method may also include where the diamond growth within one or more substrate temperature range(s) defines a first stage of diamond growth and one or more substrate temperature range(s) defines a second stage of diamond growth and where the first stage of diamond growth includes bi-dimensional nucleation growth morphologies and the second stage of diamond growth includes step-flow growth morphologies. The method may further include adjusting carbon or non-carbon containing gas concentrations in the process gas during the growth of the diamond. The method may also include where the process gas further includes a gas selected from the group consisting of nitrogen-carrier gas, boron-carrier gas, phosphorus-carrier gas, n-type dopant carrier gas, p-type dopant carrier gas, and a combination thereof. The method may also include where the adjusting of the substrate temperature is controlled by adjusting plasma power. The method may also include where the adjusting of the substrate temperature is controlled by adjusting a resistive heater. The method may also include where the first stage of diamond growth is configured to inhibit hillock and inclusion formation to promote high crystallinity. The method may further include adjusting carbon or non-carbon containing gas concentrations in the process gas during the growth of the diamond. The method may also include where the process gas further includes a gas selected from the group consisting of nitrogen-carrier gas, boron-carrier gas, phosphorus-carrier gas, n-type dopant carrier gas, p-type dopant carrier gas, and a combination thereof. The method may also include where the adjusting of the substrate temperature is controlled by adjusting plasma power. The method may also include where the adjusting of the substrate temperature is controlled by adjusting a resistive heater. The method may further include a cooling water supply and the adjusting of the substrate temperature is controlled by adjusting the cooling water supply.

Further areas of applicability will become apparent from the description provided herein. It should be understood that the description and specific examples are intended for purposes of illustration only and are not intended to limit the scope of the present disclosure.

BRIEF DESCRIPTION OF THE DRAWINGS

In order that the disclosure may be well understood, there will now be described various forms thereof, given by way of example, reference being made to the accompanying drawings in which:

FIG. 2A is a graphical illustration of a temperature variability method of the present disclosure with a single temperature variation after the methane ($CH_4$) is introduced FIG. 2B is a graphical illustration of a temperature variability method of the present disclosure with a temperature increase, a decrease, and another increase after the $CH_4$ is introduced.

FIG. 2C is a graphical illustration of a temperature variability method of the present disclosure with multiple temperature increases and decreases after the $CH_4$ is introduced.

FIG. 2D is a term key for the labels used in FIGS. 2A, 2B, and 2C.

FIG. 14 illustrates a process 1400 in accordance with an aspect of the present disclosure.

FIG. 15 illustrates a process 1500 in accordance with another aspect of the present disclosure.

FIG. 16 illustrates a process 1600 in accordance with yet another aspect of the present disclosure.

Figure 1A:
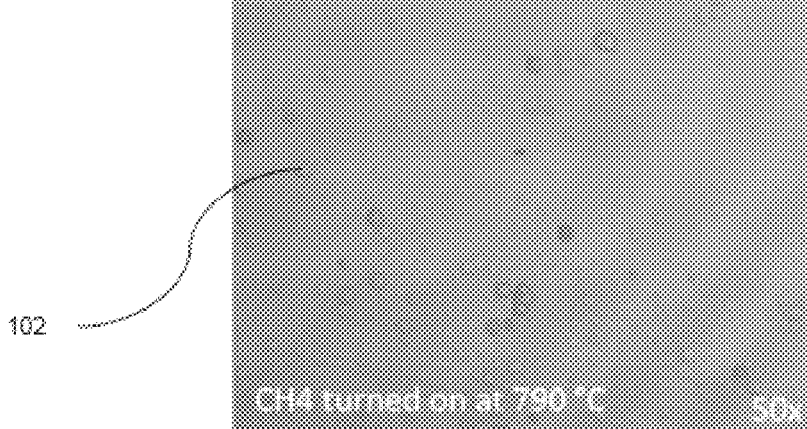
FIG. 1A is a microscopic view of CVD grown diamond that illustrates nucleation growth morphology features on a sample where growth was initiated at a temperature of 790° C.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure provides for an improved process for homoepitaxial diamond growth using chemical vapor deposition ("CVD") at variable temperatures. The formation of defects in CVD grown diamonds decreases the quality of diamonds and can limit the performance of final products. The present disclosure provides for a process that includes varying growth temperature configured to reduce and/or inhibit inclusion formation and extended defect formation. A relatively low diffusion rate of surface carbon results in a bi-dimensional nucleation growth mode, and a relatively high diffusion rate of surface carbon results in a step-flow growth mode.

Typically, homoepitaxial CVD diamond growth technique occurs under set growth conditions, including growth chamber pressure, substrate temperature, process gas flow rates and composition, substrate crystallographic offcut, and growth duration. Often, the select pressure is from within a range of approximately 50 to 400 torr. A typical select substrate temperature can be from within the range of approximately 750 to 1050° C. The process gas typically includes Hydrogen ($H_2$) and Methane ($CH_4$), and the typical select methane to hydrogen ratio [$CH_4$:$H_2$] can be from within the range of approximately 1 to 8%. Oxygen containing gases can be included to inhibit defect formation. A typical $O_2$ concentration in the process gas is 0.5 to 2%. Nitrogen ($N_2$) is used as an additive in diamond CVD processes. The addition of $N_2$ into the diamond growth process gas can increase the rate of diamond growth significantly.

The presence of $O_2$ or $N_2$ has been found to affect the morphology of the growth surface. [See, e.g., Achard et al. (2007), *Coupled effect of nitrogen addition and surface temperature on the morphology and the kinetics of thick CVD diamond single crystals*, Diamond & Related Materials 16 (2007) 685-689]. Achard et al. (2007) disclose that including a relatively low amount of $N_2$ in the process gas results in a step-flow growth morphology, characterized by square-based pyramidal surface features and acute step-like surface features. Alternatively, including a relatively high amount of $N_2$ in the process gas results in bi-dimensional nucleation growth morphology, characterized by rounded and more smooth surface features. Achard1 discloses two growth modes, the step-flow growth mode and the bi-dimensional nucleation growth mode. It also discloses that adding or increasing $N_2$ in the process gas, increases supersaturation of the Carbon (C) that incorporates into the growing diamond. A high supersaturation of the carbon species on the growing surface, for a given growth substrate temperature, is characterized by low mobility of the adsorbed carbon species on the surface, and results in the bi-dimensional nucleation growth morphology. When the $N_2$ concentration in the process gas is relatively low, for a given substrate temperature, the surface mobility of the carbon species is higher, which results in the step-flow growth morphology.

The concept of at least two types of growth modes as it pertains to diamond CVD is further disclosed by Teraji (2008) [(See Teraji, *Chemical Vapor Deposition of Homoepitaxial Diamond Films*, Chapter 3, Physics and Applications of CVD Diamond. Satoshi Koizumi, Christoph Nebel, and Milos Nesladek (2008))]. Teraji (2008) discloses that the homoepitaxial CVD diamond growth mode changes from the reaction-controlled growth mode to the diffusion-controlled growth mode. The reaction-controlled growth mode is characterized by bi-dimensional growth morphology. The diffusion-controlled growth mode is characterized by step-flow growth morphology. Thus, bi-dimensional growth mode is equivalent to the reaction-controlled growth mode, and the step-flow growth mode is equivalent to the diffusion-controlled growth mode.

The concept of at least two types of growth modes as it pertains to diamond CVD is further disclosed by Yamada et al. (2016) [See Yamada et al., *Effects of intentionally introduced nitrogen and substrate temperature on growth of diamond bulk single crystals*, Jpn. J. Appl. Phys. 55 01AC07 (2016). http://doi.org/10.7567/JJAP.55.01AC07]. Yamada et al. (2016) discloses that the diamond CVD growth at a select substrate temperature below 900° C. with $N_2$ additive results in a nondiamond-like morphology, characteristic of a bi-dimensional growth mode. On the other hand, Yamada et al. (2016) reported that diamond CVD growth at a select substrate temperature greater than 900° C. resulted in step-flow growth morphology, characteristic of the step-flow growth mode. Yamada et al. (2016) disclose that the bi-dimensional growth mode should be avoided during diamond CVD.

Okushi et al. (2002) disclose that the step-flow growth mode is ideal and that the bi-dimensional growth mode is detrimental to electronic device performance [See Okushi et al., *Device-grade homoepitaxial diamond film growth*, Journal of Crystal Growth 237-239 (2002) 1269-1276.].

Achard et al. (2005) disclose CVD diamond grown in the bi-dimensional growth mode at 750° C. has a poor surface crystallinity [See Achard et al., *The control of growth parameters in the synthesis of high quality single crystalline diamond by CVD*, Journal of Crystal Growth 284 (2005) 396-405]. Polycrystalline diamond grown using the heteroepitaxial CVD growth method also exhibits bi-dimensional growth morphologies at select substrate temperatures below 750° C.

Ali et al. 1 (2012) and Ali et al. 2 (2012) disclose the heteroepitaxial CVD growth of diamond with a nondiamond-like growth morphology characteristic of the bi-dimensional growth mode at 750° C., and an increase in defect concentration as characterized using Raman spectroscopy

[See Ali et al. (1), *Growth of in situ multilayer diamond films by varying substrate-filament distance in hot-filament chemical vapor deposition*, J. Mater. Res., Vol. 27, (2012). DOI: 10.1557/jmr.2012.378. doi:10.1016/j.jcrys-gro.2005.07.046; Ali et al. (2), Effect of substrate temperature on hot-filament CVD grown diamond films at constant filament current, Int. J. Surface Science and Engineering, Vol. 6, No. 3, (2012)].

Thus, it is disclosed in in the literature that it is preferred that homoepitaxial CVD diamond growth takes place under select or fixed conditions that result in the step-flow growth mode, and that the select substrate temperature should be greater than 800° C. in some cases and 900° C. in some cases. There are a few reports of homoepitaxial CVD diamond growth being done with more than one select set of conditions. Takeuchi et al. (1999), disclose a homoepitaxial CVD growth method wherein the methane concentration was at a lower set point in the first step, then increased to a higher set point in the second step [See Takeuchi et al., High quality homoepitaxial diamond thin film synthesis with high growth rate by a two-step growth method, Diamond and Related Materials 8 (1999) 1046-1049]. Polyakov et al. (2022), disclose a homoepitaxial CVD growth method wherein a high flow of $N_2$ is included in the process gas in the first step, and then the $N_2$ is removed from the process gas in the second step[See Polyakov et al. *Large-Sized X-ray Optics Quality Chemical Vapor Deposition*, PHYS. STATUS SOLIDI RRL, 16:2200164., (2022), https://doi.org/10.1002/pssr.202200164]. Nad et al. (2016), disclose a homoepitaxial CVD growth method wherein the substrate temperature is changed for the purpose of enlarging the lateral area of the grown diamond plate. The substrate temperature is greater than 980° C. throughout the process [See Nad et al., *MPACVD growth of single crystalline diamond substrates with PCD rimless and expanding surfaces*, APPLIED PHYSICS LETTERS 109, 162103 (2016). http://dx.doi.org/10.1063/1.4965025].

Referring to FIGS. 1A-8B, the present disclosure provides for a process related to a CVD growth process having two or more growth stages. In an example, a growth process includes preparing a surface plane of a diamond substrate for growth by polishing, reactive ion cleaning (to remove polishing damage), and cleaning. Growth parameters may be preselected and adjusted to achieve certain desired outcomes. Growth parameters may include, but are not limited to: substrate temperature, pressure, hydrogen ($H_2$) gas flow, carbon-containing gas flow (e.g., methane gas ($CH_4$) flow), and nitrogen ($N_2$) gas flow.

In an example, diamond growth occurs in the presence of $H_2$, plasma, and a carbon-containing gas. The process includes initiating a flow of $H_2$ and igniting plasma at a suitably low pressure (e.g., ~667 Pa/5 torr). Once ignited, the pressure and plasma power are increased to approach target conditions, such as a desired substrate temperature or substrate temperature target range or pressure range. Substrate temperature will rise to a growth temperature condition as pressure and plasma power are adjusted. The substrate temperature can be measured using a single-color infrared pyrometer. In this example, the pyrometer is set with an emissivity setpoint of 0.6. Once the target substrate temperature condition is reached, carbon-containing gas flow is started to initiate the growth. In this example, the carbon-containing gas includes $CH_4$. The process may also include $N_2$ and/or $CO_2$ flow. The parameters are controllable for the duration of the growth process.

The CVD diamond growth process is dependent on substrate temperature. CVD diamond can grow in at least two modes. At high substrate temperatures, for example, greater than or equal to about 800° C., hydrocarbon species tend to mobilize on the surface and incorporate at low energy states, which are found at kink steps and step edges; this results in a step-flow type of growth morphology, also referred to as a diffusion-controlled growth mode.

At low substrate temperatures, for example less than about 800° C., the surface mobility of the hydrocarbon species is more restrained. At lower substrate temperatures, carbon tends to incorporate more evenly across the surface; and this results in a bi-dimensional nucleation growth morphology, also referred to a reaction-controlled growth mode.

Typically, diamond is grown in a relatively higher substrate temperature step-flow type growth mode regime. This is thought to be done to promote higher quality, lower defect diamond. It was discovered that initiating growth at an elevated substrate temperature results in inclusion formation, which can be undesirable. At onset, the hydrocarbon species mobilize and congregate at isolated locations and form hillocks. These hillocks continue to increase in size because, as three-dimensional features, they can be subject to the highest plasma density and growth rate.

Growth at a hillock enters a runaway state that ultimately leads to non-epitaxial defect formation or an inclusion at the hillock peak. Once formed this inclusion is the source of a high density of dislocations that extend to the overgrown material. These are the sources of dislocation bundles, or killer defects.

However, according to the present disclosure, it was discovered that initiating diamond growth at lower substrate temperatures in a bi-dimensional nucleation type growth mode, then increasing the substrate temperature into a step-flow type growth mode, can reduce and/or inhibits defect formation and promotes the growth of high-quality diamond.

In an example, under the conditions of about 23,998 Pa (180 torr), $CH_4$ at a process gas mass flow rate of approximately 5%, and $N_2$ at a mass flow rate of 1 parts per million, a difference in growth modes is observed around 800° C. At about 750° C. bi-dimensional nucleation dominated growth morphologies occur and at about 830° C. step-flow growth morphologies occur.

Raman spectroscopy measurements of diamond grown below 800° C. are reported to have increased peak widths which indicates lower crystallinity. Thus, CVD diamond is typically carried out in the step-flow growth mode regime. However, in the method according to the present disclosure, there is a benefit to initiating growth in a bi-dimensional nucleation growth mode regime and then adjusting to a step-flow growth mode.

In an example, a diamond CVD process includes a $H_2$ flow and plasma at low pressure (e.g., about 667 Pa/5 torr). Once ignited the pressure and plasma power are adjusted (e.g., increased) to target conditions. Substrate temperature rises to a target temperature condition (like a target temperature or temperature range configured for diamond growth as pressure increases and power to plasma is increased). In an example process, $CH_4$ (and $N_2$ flow if included) are initiated when the target temperature condition is reached to begin growth.

Figure 1B:
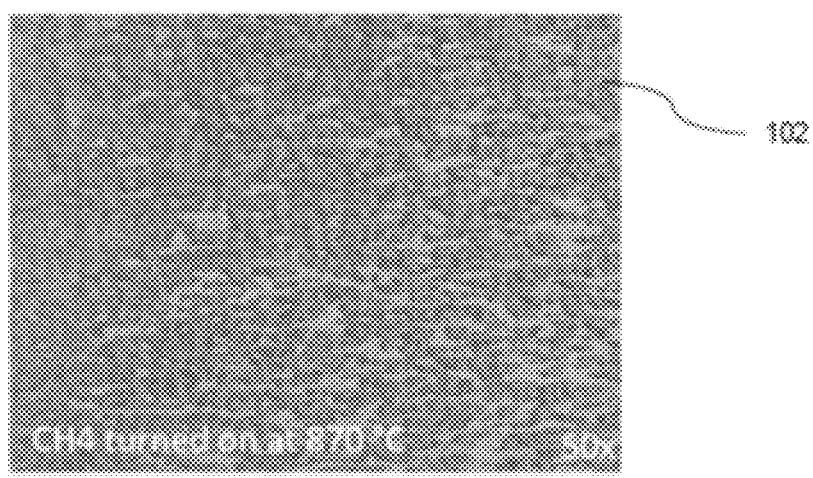
FIG. 1B is a microscopic view of CVD grown diamond that illustrates hillock formations on a sample where growth was initiated at a temperature of 870° C.

The present disclosure provides for a system and method of growth that can be initiated before substrate temperature reaches a steady state growth temperature. FIGS. 1A and 1B, illustrate a comparison of two microscope photographs at 50× magnification of two 30-micron thick CVD diamond layers grown under approximately the same process gas flow and substrate temperature conditions, but with different $CH_4$ introduction temperatures. In FIG. 1B, $CH_4$ is introduced at a steady state substrate temperature of about 870° C., which results in a high density of hillocks 102 being observed. In FIG. 1A, $CH_4$ is introduced at a substrate temperature of about 790° C. illustrating a much less jagged growth morphology and included a much lower density of hillocks 102.

The present disclosure provides for growth that occurs at a bi-dimensional nucleation growth mode regime and then shifts to a step-flow growth mode regime for a portion of the process. An increase in smoothness and decrease in hillocks was found. This may be the result of dispersing on the growth surface with a multitude of relatively evenly distributed nucleation sites at the point when $CH_4$ flow is initiated in a bi-dimensional nucleation growth mode regime. Once nucleated, substrate temperature can be increased thereby reducing and/or inhibiting hillock/inclusion formation and promoting high crystallinity.

In an example, growth is initiated before the substrate temperature reaches a steady state growth temperature. Growth is started in a bi-dimensional nucleation growth mode regime to disperse on the growth surface with a multitude of evenly distributed nucleation sites. Once nucleated, substrate temperature is increased to promote high crystallinity. FIG. 2A-2D show examples of substrate temperature versus time profiles that were tested and within the scope of the present disclosure. In the example of FIG. 2A, the temperature follows an initial ramp-up for a first period of time followed by continued temperature rise after the $CH_4$ is initiated and then reaching a steady temperature target. In the example of FIG. 2B, the substrate temperature follows an initial ramp-up for a first period of time followed by a temperature rise after the $CH_4$ is initiated and then reaching a steady temperature target for another period of time before lowering the temperature and then raising it again. In the example of FIG. 2C, the substrate temperature is lowered and raised multiple times. FIG. 2D provides a listing of example adjustable parameters including, but not limited to: T_low . . . n (e.g., relatively low temperature for initial growth); Time_dwell_1 . . . n (e.g., a first time period of growth); RampUp_1 . . . n (e.g., a period of time for increased temperature condition); T_high_1 . . . n (e.g., relatively high temperature for initial growth); Time_steady_1 . . . n (e.g., time period for relatively steady raised/high temperature condition for growth); and Ramp-Down_1 . . . n (e.g., a period of time for decreased temperature condition).

As growth continues, substrate temperature may be lowered one or more times at set times and for set durations. This may occur when the gas composition is changed, though it is not required that the gas composition changes when temperature is lowered. Lowering the temperature then raising it can happen at isolated times or it can happen periodically at fixed intervals.

By modulating substrate temperature throughout growth, depending on whether the gas chemistry was varying or steady-state, a reproducible process to synthesize high $N_2$ diamond (e.g., substitutional N~ 5-8 parts per million) that shows little to no more strain under birefringence microscopy than the starting substrate was achieved.

Figure 3A:
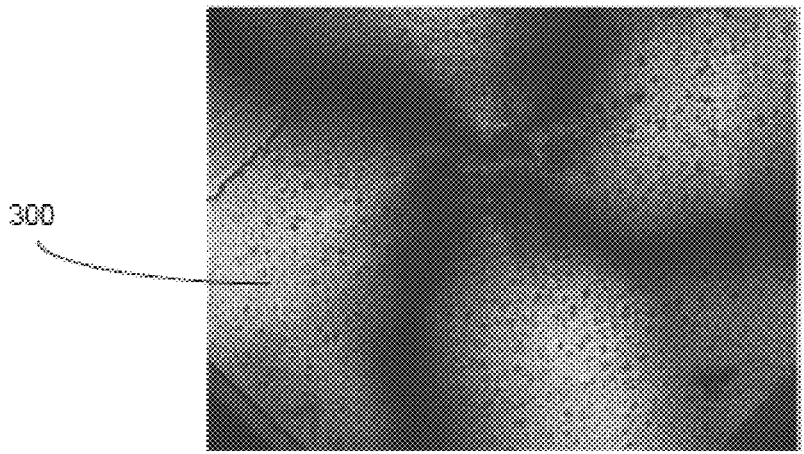
FIG. 3A illustrates optical birefringence microscopy images of high strain diamond plate grown using a High Pressure High Temperature (HPHT) method.
Figure 3B:
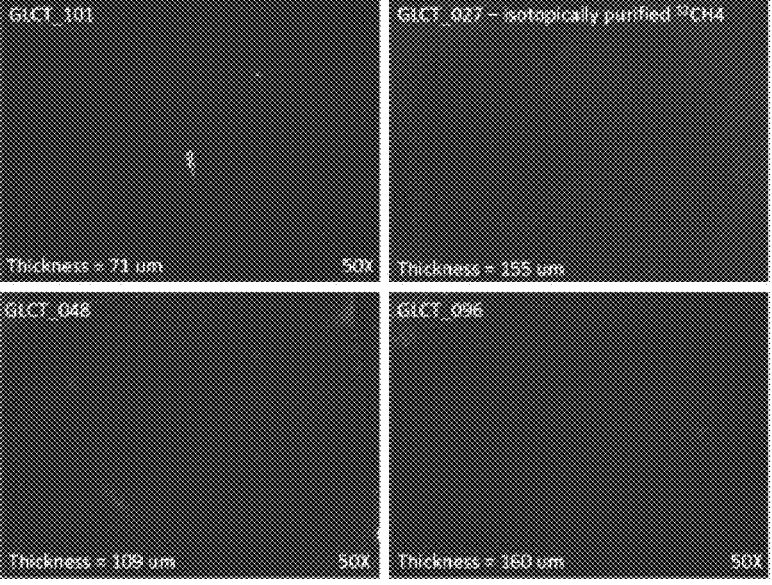
FIG. 3B Illustrate optical birefringence microscopy images of homoepitaxial CVD diamond grown by a temperature variability method according to the present disclosure with samples labeled as GLCT_101, GLCT_027, GLCT_048, and GLCT_096.

FIGS. 3A-3B illustrate cross-polarized birefringence (CFB) microscopy images taken for several samples labeled samples. CFB is a technique to assess strain in crystals. Strain indicates defects and imperfections in the crystal and will manifest in the image as bright spots, shapes, or streaks. FIG. 3A, is an example of a high stress sample with visible inclusions 300 illustrated by large, 4-lobed white pattern present in the image. In comparison, FIG. 3B illustrates several samples grown to layers up to 160 μm thick created by a variable temperature method of the present disclosure, in which very little imperfections are detected, as evidenced by the nearly completely black CFB images. The four samples, labeled GLCT_101, GLCT_027, GLCT_048, and GLCT_096, were grown using another example variable substrate temperature method of the present disclosure in which $N_2$ was used as an additive and the created diamond has a substitutional N concentration of approximately 5-8 parts per million.

Figure 4A:
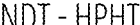
FIG. 4A illustrates an optical birefringence microscopy image of a high-quality seed substrate grown using an HPHT method.
Figure 4A:
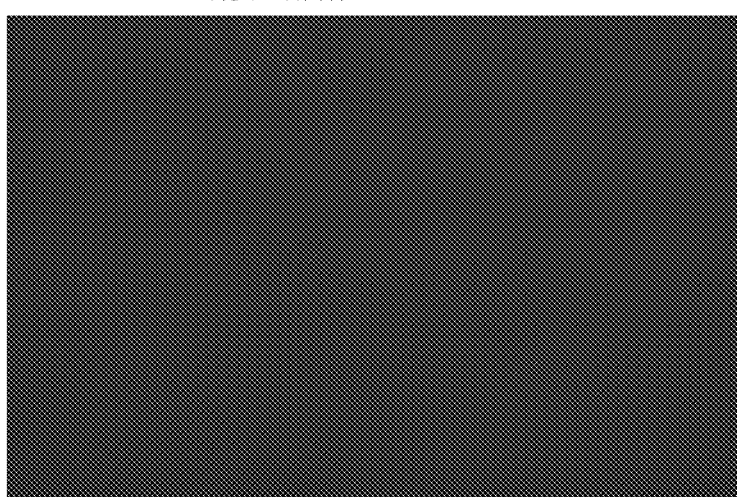
Figure 4B:
FIG. 4B illustrates optical birefringence microscopy images of a high-quality seed substrate grown according to a temperature variability method of the present disclosure showing a seed substrate with a 160-micron thick homoepitaxial CVD layer grown on top of it and labeled GLCT_096.

Referring to FIGS. 4A-4B, a surface photograph of a diamond formed by a variable temperature method of the present disclosure is shown and labeled as GLCT_096 (FIG. 4B). This sample includes a 160-micron thick CVD layer created using the disclosed method on top of an NDT seed substrate. GLCT_096 was grown using a process of the present disclosure in which $N_2$ was used as an additive and the diamond has a substitutional N concentration of approximately 5-8 parts per million. GLCT_096 has indications of similar levels of strain as the starting substrate obtained from NEW DIAMOND TECHNOLOGY (NDT), as evidenced by the nearly completely black CFB images for both the NDT seed substrate (FIG. 4A) and GLCT_096 homoepitaxial CVD layer. For comparison, the NDT substrate is manufactured using a more energy intensive process called high-pressure, high-temperature method (HPHT).

Figure 5:
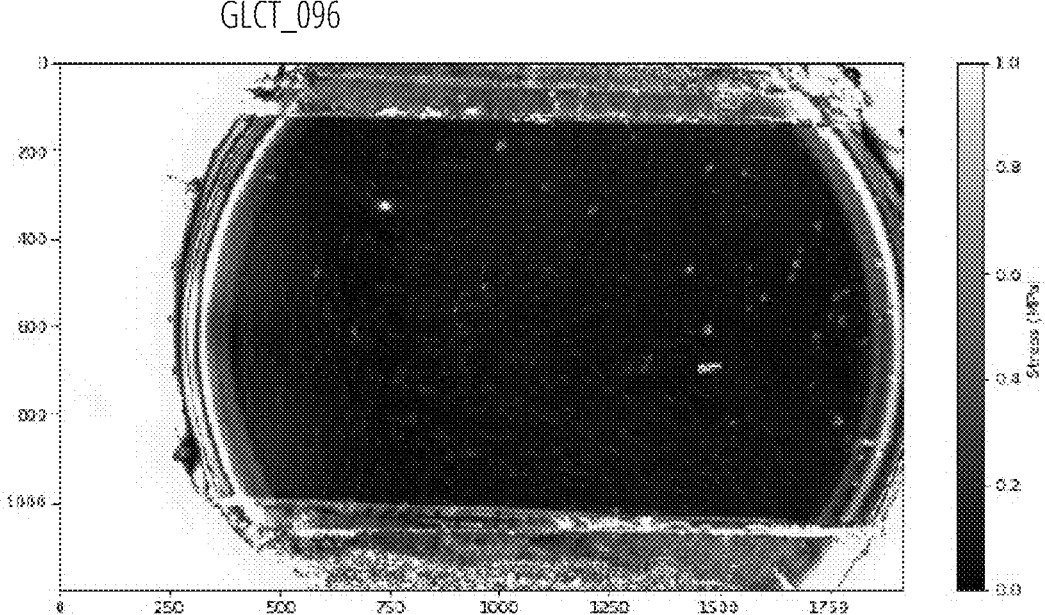
FIG. 5 illustrates a quantitative birefringence microscopy image of Sample GLCT_096.

Referring to FIG. 5, a microscope photo of sample GLCT_096 is shown. This sample includes of a 160-micron thick CVD layer formed on top of the NDT seed substrate. GLCT_096 was grown using a variable temperature process of the present disclosure in which $N_2$ was used as an additive and the created diamond having a substitutional N concentration of approximately 5-8 parts per million. This sample has an average level of stress of approximately 0.2 MPa according to a quantitative birefringence measurement method, indicating its high crystalline quality.

Figure 6:
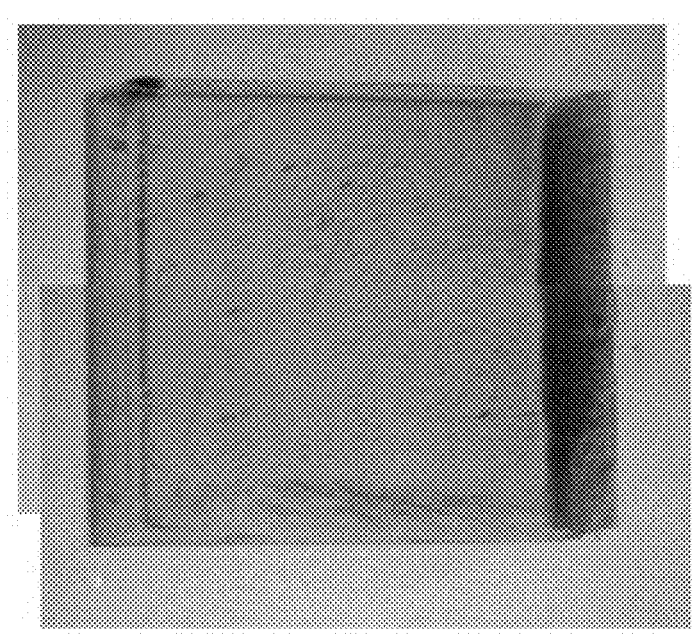
FIG. 6 illustrates an x-ray white beam topography image of Sample GLCT_096.

Referring to FIG. 6, the GLCT_096 diamond sample is shown. This is an image as measured by x-ray white beam topography at the Advanced Photon Source and Argonne National Laboratory. For comparison, the NDT substrate (FIG. 4A) is manufactured using a more energy intensive HPHT process.

Figure 7:
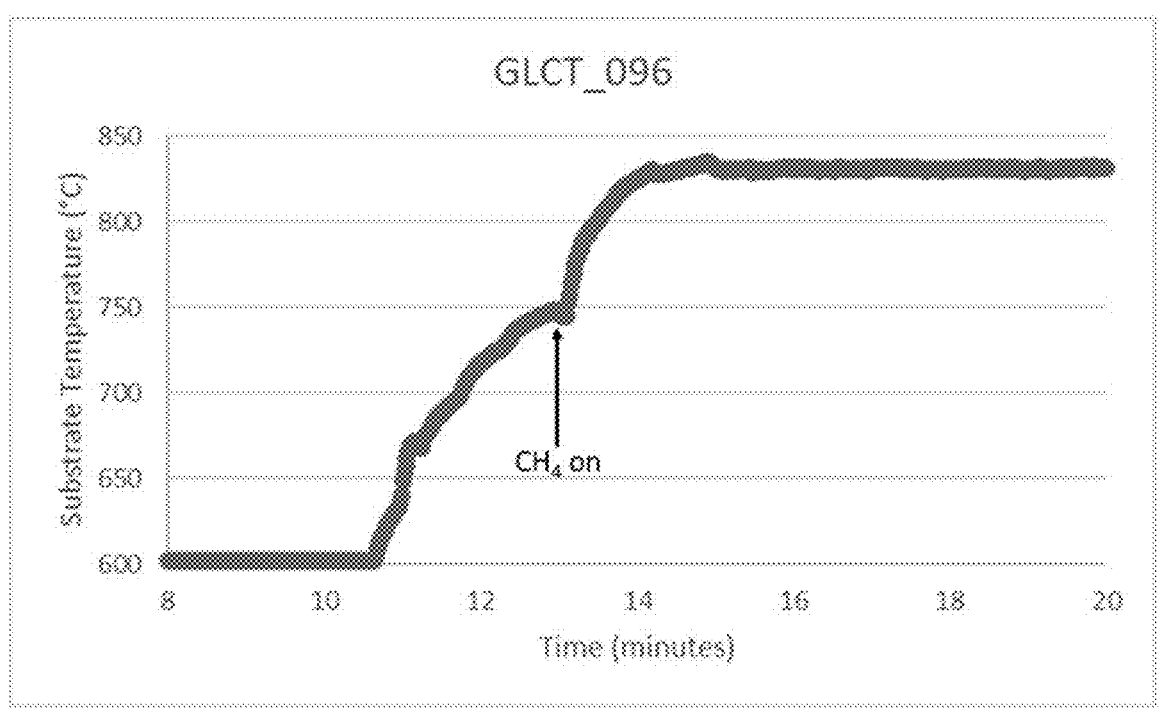
FIG. 7 graphically illustrates substrate temperature vs. growth time for the first 20-minutes of the GLCT_096 growth process.

Referring to FIG. 7, the substrate temperature versus growth time is shown for the first 20 minutes of the GLCT_096 growth process. At the process start, at time=0 minutes, $H_2$ is turned on and remains on throughout the entire process. $CH_4$ is added at the marked time and stays on throughout the remainder of the process.

Figure 8:
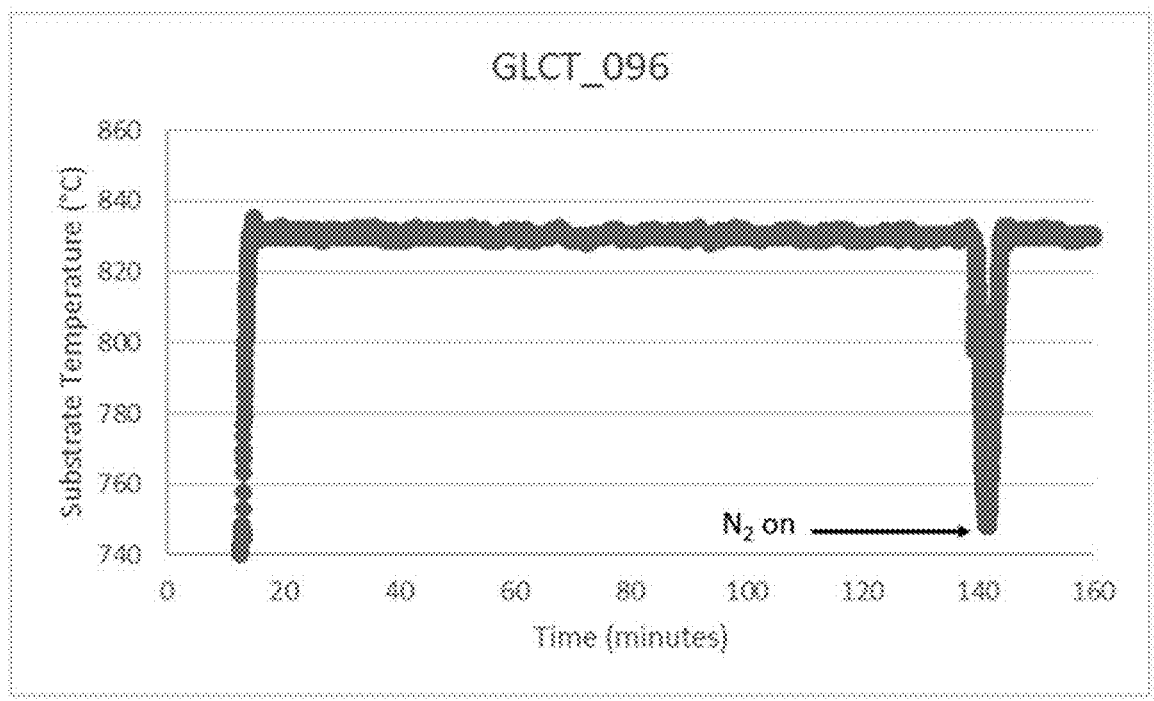
FIG. 8 graphically illustrates the substrate temperature vs growth time for the first 160-minutes of the GLCT_096 growth process.

Referring to FIG. 8, the substrate temperature versus growth time is shown for the first 160 minutes of the GLCT_096 growth process. At the process start, at time=0 minutes, $H_2$ is turned on and remains on throughout the entire process. $CH_4$ is added to the process gas at the marked time and stays on throughout the remainder of the process. $N_2$ is added to the process gas and remains on throughout the remainder of the process.

Figure 9:
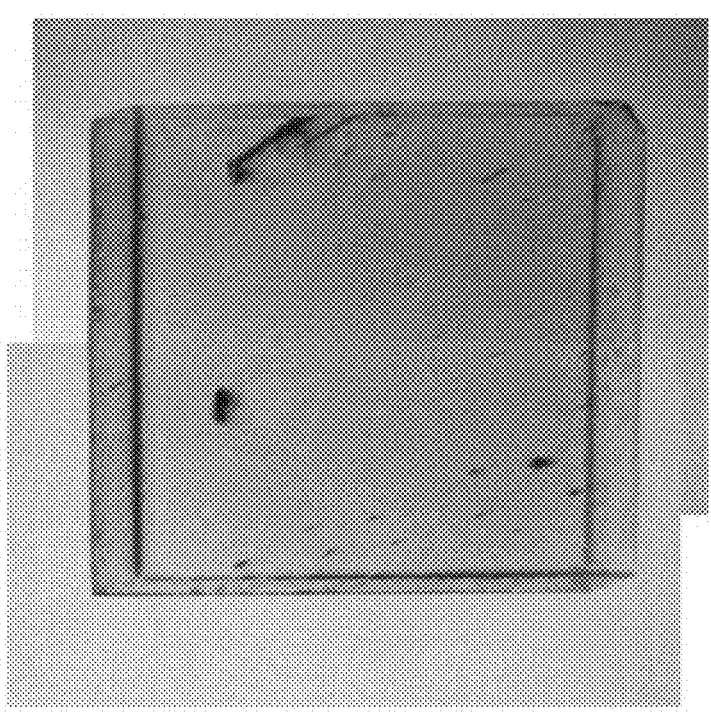
FIG. 9 illustrates an x-ray white beam topography image of Sample GLCT_101.

Referring to FIG. 9, a diamond formed according to a process of the present disclosure is shown and labeled as GLCT_101. This sample consists of a 71-micron thick CVD layer formed on top of the NDT seed substrate (FIG. 4A). GLCT_101 was grown using a process in which $N_2$ was used as an additive and the created diamond has a substitutional N concentration of approximately 5-8 parts per million. GLCT_101 contains few dislocation defects more than the starting substrate obtained from NDT, as measured by x-ray white beam topography at the Advanced Photon Source and Argonne National Laboratory. For comparison, the NDT substrate (FIG. 4A) is manufactured using a more energy intensive HPHT process.

Figure 10:
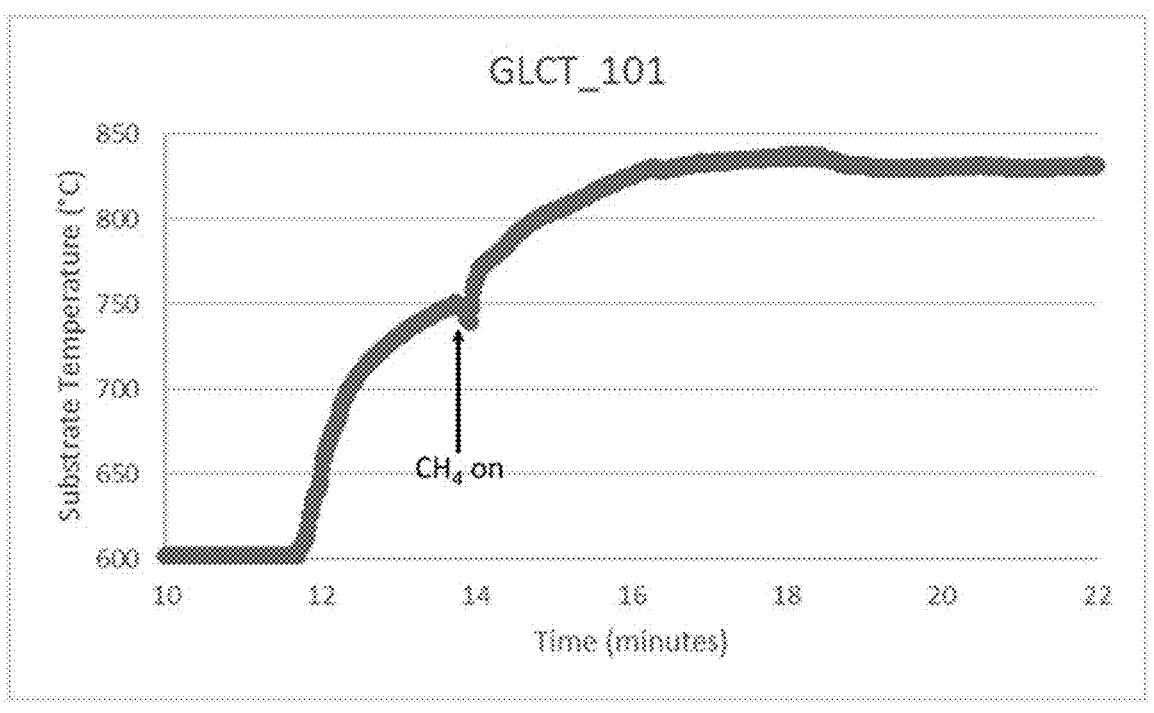
FIG. 10 graphically illustrates the substrate temperature vs growth time for the first 22-minutes of the GLCT_101 growth process.

Referring to FIG. 10, the substrate temperature versus growth time is shown for the first 22 minutes of the GLCT_101 growth process. At the process start, at time=0 minutes, $H_2$ is turned on and remains on throughout the entire process. $CH_4$ is added at the marked time and stays on throughout the remainder of the process.

Figure 11:
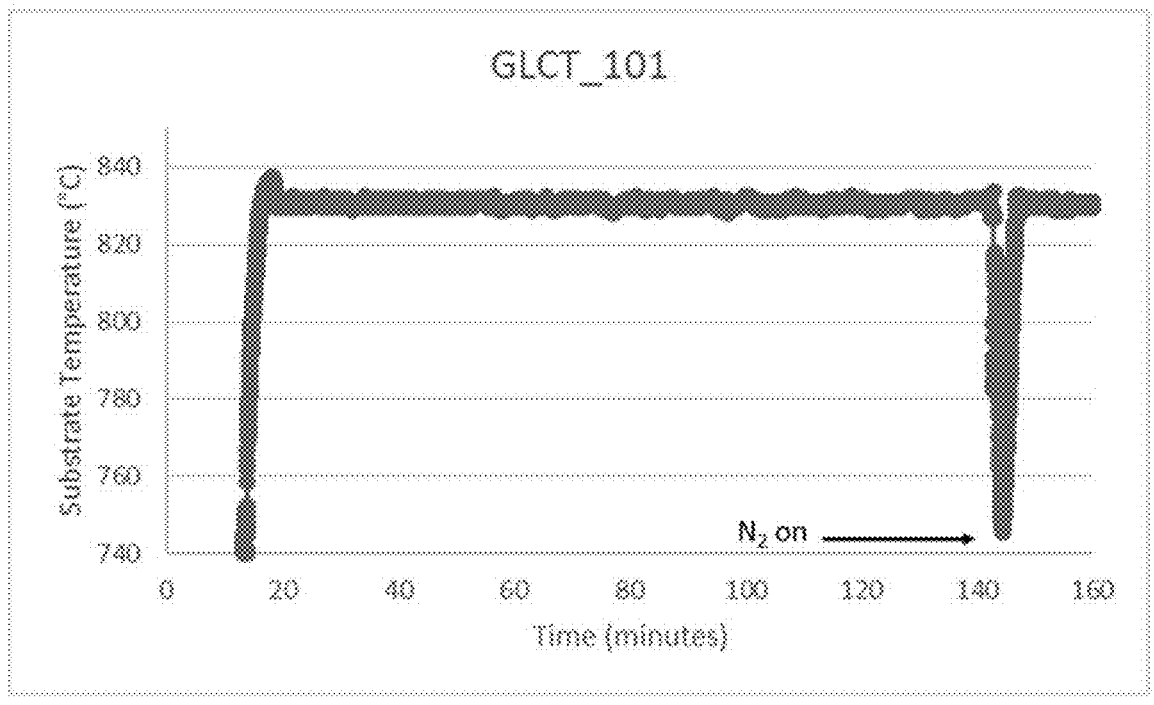
FIG. 11 illustrates the substrate temperature vs growth time for the first 160-minutes of the GLCT_101 growth process.

Referring to FIG. 11, the substrate temperature versus growth time is shown for the first 160 minutes of the GLCT_101 growth process. At the process start, at time=0 minutes, $H_2$ is turned on and remains on throughout the entire process. $CH_4$ is added to the process gas at the marked time and stays on throughout the remainder of the process. $N_2$ is added to the process gas and remains on throughout the remainder of the process.

Figure 12A:
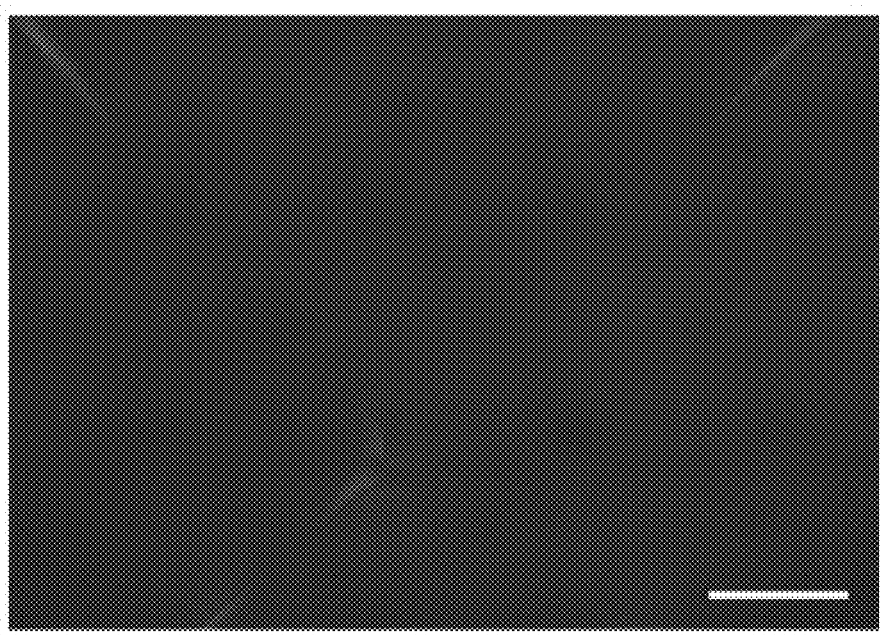
FIG. 12A illustrates an optical birefringence microscopy image of an HPHT seed substrate.
Figure 12B:
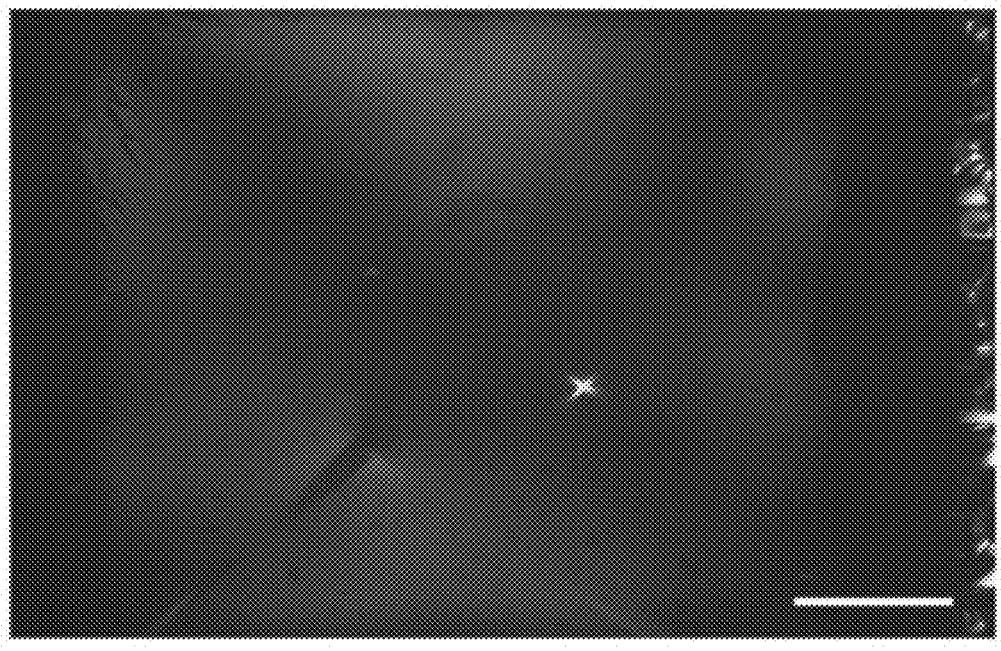
FIG. 12B illustrates an optical birefringence microscopy image of a seed substrate having a 130-micron thick CVD diamond layer that was grown on the HPHT seed substrate of FIG. 12A labeled Sample GLCT_205.

Referring to FIG. 12A and FIG. 12B, comparison microscope photos are provided. FIG. 12B illustrates a diamond formed according to the process of the present disclosure and labeled as GLCT_205. This sample consists of a 130-micron thick CVD layer formed on top of an HPHT seed substrate (FIG. 12A). GLCT_205 was grown using a process of the present disclosure in which no $N_2$ was used as an additive and the grown diamond has a substitutional N concentration beneath 30 parts per billion. GLCT_205 illustrates a sample grown to a layer thickness of 30-microns in which very little imperfections are detected, as evidenced by the nearly completely black images in CFB for both the HPHT seed substrate (FIG. 12A) and GLCT_205 (FIG. 12B). The bright, four-lobed feature in GLCT_205 is a defect that originates from the seed substrate.

Figure 13:
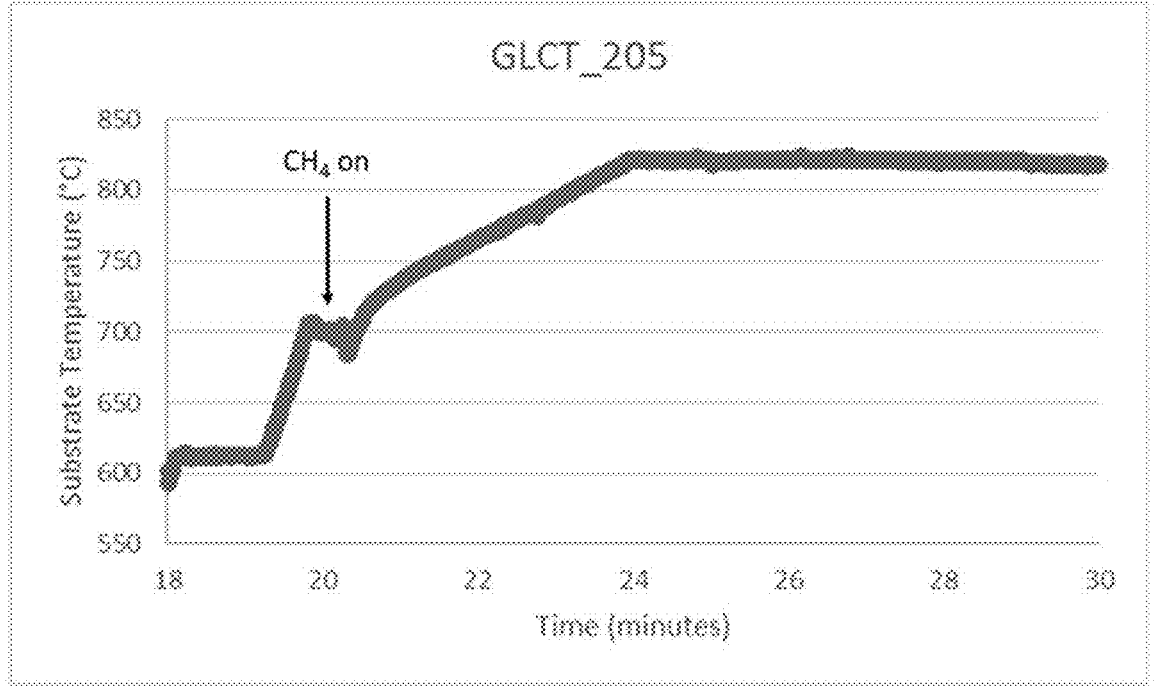
FIG. 13 illustrates the substrate temperature vs growth time for the first 30-minutes of the GLCT_205 growth process.

Referring to FIG. 13, the substrate temperature versus growth time is shown for the first 30 minutes of the GLCT_205 growth process. At the process start, at time=0 minutes, $H_2$ is turned on and remains on throughout the entire process. $CH_4$ is added at the marked time and stays on throughout the remainder of the process.

FIG. 14 illustrates a variable temperature process according to the present disclosure. According to process 1400, the method includes growing a single crystal diamond material synthesized using a homoepitaxial chemical vapor deposition process. The method begins at block 1402 by placing a free-standing diamond starting seed substrate on a substrate holder within a reaction chamber for chemical vapor deposition. The process continues to block 1404 where a process gas is fed into the reaction chamber. The process gas including hydrogen gas. At block 1406, a plasma is ignited within the reaction chamber to activate the process gas by adjusting the substrate temperature to increase to a first target substrate temperature. At block 1408, a carbon-containing gas, like methane, is added to the process gas once the substrate temperature is at or near the first target substrate temperature to initiate diamond growth. The process advances to block 1410, where the substrate temperature is adjusted to a second target substrate temperature that is different from the first target substrate temperature during the diamond growth. In a further example, the substrate temperature range is adjusted multiple times up and down.

FIG. 15 illustrates a variable temperature process according to the present disclosure. In block 1502, process 1000 includes placing a free-standing diamond starting seed substrate on a substrate holder within a reaction chamber for chemical vapor deposition. In block 1504, process 1500 further includes feeding a process gas into the reaction chamber. The process gas includes hydrogen gas. In block 1506, process 1500 includes igniting a plasma within the reaction chamber to activate the process gas by adjusting the substrate temperature to increase to be within a first substrate temperature range. In block 1508, process 1500 includes adding a carbon-containing gas to the process gas once the substrate temperature is within the first substrate temperature range to initiate diamond growth. In block 1510, process 1500 includes adjusting the substrate temperature to a second substrate temperature range that is outside the first substrate temperature range during the diamond growth. In a further example, the substrate temperature range is adjusted multiple times up and down.

FIG. 16 illustrates a variable temperature process according to the present disclosure. In block 1602, process 1600 includes placing a diamond substrate on a substrate holder within a chemical vapor deposition reaction chamber. In block 1604, process 1600 includes feeding a process gas into the reaction chamber. The process gas includes hydrogen gas. In block 1606, process 1600 includes igniting a plasma within the reaction chamber to activate the process gas by adjusting a substrate temperature to be within a first substrate temperature range defining a bi-dimensional nucleation growth regime. In block 1608, process 1600 includes feeding a carbon-containing gas to the process gas to grow diamond on the diamond substrate within a bi-dimensional nucleation growth regime. In block 1610, process 1600 includes adjusting the substrate temperature to a second substrate temperature range that is outside the first substrate temperature range during the diamond growth. The second substrate temperature range defines a step-flow growth regime. In a further example, the substrate temperature range is adjusted between the bi-dimensional nucleation growth regime and the step-flow growth regime.

The foregoing description of various forms of the invention has been presented for purposes of illustration and description. It is not intended to be exhaustive or to limit the invention to the precise forms disclosed. Numerous modifications or variations are possible in light of the above teachings. The forms discussed were chosen and described to provide the best illustration of the principles of the invention and its practical application to thereby enable one of ordinary skill in the art to utilize the invention in various forms and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of growing a single crystal diamond material synthesized using a homoepitaxial chemical vapor deposition process, the method comprising:

placing a free-standing diamond starting seed substrate on a substrate holder within a reaction chamber for chemical vapor deposition;

feeding a process gas into the reaction chamber, the process gas including hydrogen gas;

igniting a plasma within the reaction chamber to activate the process gas by adjusting the substrate temperature to increase to a first target substrate temperature;

adding a carbon-containing gas to the process gas once the substrate temperature is at or near the first target substrate temperature to initiate diamond growth; and adjusting the substrate temperature to a second target substrate temperature that is different from the first target substrate temperature during the diamond growth;

wherein the diamond growth at or near the first target substrate temperature defines a first stage of the diamond growth and the diamond growth at or near the second target substrate temperature defines a second stage of the diamond growth, and wherein the first stage of diamond growth includes bi-dimensional nucleation growth morphologies, and the second stage of diamond growth includes step-flow growth morphologies.

2. The method of claim 1, wherein the first target substrate temperature is configured to inhibit hillock and inclusion formation to promote high crystallinity.

3. The method of claim 1, further comprising the steps of adjusting the substrate temperature to one or more additional different substrate target temperatures.

4. The method of claim 1, wherein the second target substrate temperature is at least 10° C. higher or lower than the first target substrate temperature.

5. The method of claim 1, wherein the second target substrate temperature is at least 20° C. higher or lower than the first target substrate temperature.

6. The method of claim 1, further comprising adjusting the carbon or non-carbon containing gas concentrations in the process gas during the growth of the diamond.

7. The method of claim 1, wherein the process gas further includes a gas selected from the group consisting of nitrogen-carrier gas, boron-carrier gas, phosphorus-carrier gas, n-type dopant carrier gas, p-type dopant carrier gas, and a combination thereof.

8. The method of claim 1, wherein the adjusting of the substrate temperature is controlled by adjusting plasma power.

9. The method of claim 1, wherein the adjusting of the substrate temperature is controlled by adjusting a resistive substrate holder heater power.

10. The method of claim 1, wherein the adjusting of the substrate temperature is controlled by adjusting a cooling water supply.

11. A method of growing a single crystal diamond material synthesized using a homoepitaxial chemical vapor deposition process, the method comprising:

placing a free-standing diamond starting seed substrate on a substrate holder within a reaction chamber for chemical vapor deposition;

feeding a process gas into the reaction chamber, the process gas including hydrogen gas;

igniting a plasma within the reaction chamber to activate the process gas by adjusting the substrate temperature to increase to be within a first substrate temperature range;

adding a carbon-containing gas to the process gas once the substrate temperature is within the first substrate temperature range to initiate diamond growth; and adjusting the substrate temperature to a second substrate temperature range that is outside the first substrate temperature range during the diamond growth;

wherein the diamond growth at or near the first target substrate temperature range defines a first stage of the diamond growth and the diamond growth at or near the second target substrate temperature range defines a second stage of the diamond growth, and wherein the first stage of diamond growth includes bi-dimensional nucleation growth morphologies, and the second stage of diamond growth includes step-flow growth morphologies.

12. The method of claim 11, wherein the first substrate temperature range is configured to inhibit hillock and inclusion formation to promote crystallinity.

13. The method of claim 11, further comprising the steps of adjusting the substrate temperature to one or more different substrate temperature ranges.

14. The method of claim 13, wherein the first substrate temperature range, the second substrate temperature range, or the one or more different substrate temperature ranges define a range of ±12° C.

15. The method of claim 13, wherein the first substrate temperature range, the second substrate temperature range, or the one or more different substrate temperature ranges define a range of ±10° C.

16. The method of claim 13, wherein the first substrate temperature range, the second substrate temperature range, or the one or more different substrate temperature ranges define a range of ±5° C.

17. The method of claim 13, wherein the first substrate temperature range, the second substrate temperature range, or the one or more different substrate temperature ranges define a range of ±2° C.

18. The method of claim 11, further comprising adjusting carbon or non-carbon containing gas concentrations in the process gas during the growth of the diamond.

19. The method of claim 11, wherein the process gas further includes a gas selected from the group consisting of nitrogen-carrier gas, boron-carrier gas, phosphorus-carrier gas, n-type dopant carrier gas, p-type dopant carrier gas, and a combination thereof.

20. The method of claim 11, wherein the adjusting of the substrate temperature is controlled by adjusting plasma power.

21. The method of claim 11, wherein the adjusting of the substrate temperature is controlled by adjusting a resistive heater.

22. The method of claim 11, wherein the adjusting of the substrate temperature is controlled by adjusting a cooling water supply.

23. A method of growing a single crystal diamond material synthesized using a homoepitaxial chemical vapor deposition process, the method comprising:

placing a diamond substrate on a substrate holder within a chemical vapor deposition reaction chamber;

feeding a process gas into the reaction chamber, the process gas including hydrogen gas;

igniting a plasma within the reaction chamber to activate the process gas by adjusting a substrate temperature to be within a first substrate temperature range defining a bi-dimensional nucleation growth regime;

feeding a carbon-containing gas to the process gas to grow diamond on the diamond substrate within a bi-dimensional nucleation growth regime; and adjusting the substrate temperature to a second substrate temperature range that is outside the first substrate temperature range during the diamond growth, wherein the second substrate temperature range defines a step-flow growth regime.

24. The method of claim 23, wherein the first stage of diamond growth is configured to inhibit hillock and inclusion formation to promote high crystallinity.

25. The method of claim 23, further comprising adjusting carbon or non-carbon containing gas concentrations in the process gas during the growth of the diamond.

26. The method of claim 23, wherein the process gas further includes a gas selected from the group consisting of nitrogen-carrier gas, boron-carrier gas, phosphorus-carrier gas, n-type dopant carrier gas, p-type dopant carrier gas, and a combination thereof.

27. The method of claim 23, wherein the adjusting of the substrate temperature is controlled by adjusting plasma power.

28. The method of claim 23, wherein the adjusting of the substrate temperature is controlled by adjusting a resistive heater.

29. The method of claim 23, wherein the adjusting of the substrate temperature is controlled by adjusting a cooling water supply.

* * * * *